US012684764B2

(12) United States Patent
Chou et al.

(10) Patent No.: US 12,684,764 B2
(45) Date of Patent: Jul. 14, 2026

(54) SEMICONDUCTOR DEVICE AND METHOD OF MANUFACTURING THE SAME

(71) Applicant: Winbond Electronics Corp., Taichung City (TW)

(72) Inventors: Mei-Yuan Chou, Taichung City (TW); Yoshinori Tanaka, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 424 days.

(21) Appl. No.: 18/154,870

(22) Filed: Jan. 16, 2023

(65) Prior Publication Data
US 2024/0244834 A1　　Jul. 18, 2024

(51) Int. Cl.
*H10B 12/00*　　　(2023.01)
(52) U.S. Cl.
CPC ............. *H10B 12/50* (2023.02); *H10B 12/09* (2023.02); *H10B 12/315* (2023.02); *H10B 12/34* (2023.02)
(58) Field of Classification Search
CPC ...... H10B 12/09; H10B 12/315; H10B 12/34; H10B 12/50
See application file for complete search history.

(56) References Cited

U.S. PATENT DOCUMENTS

| | | | | |
|---|---|---|---|---|
| 6,787,417 B2* | 9/2004 | Inoue | ..................... | H10B 41/40 |
| | | | | 438/258 |
| 2001/0005611 A1* | 6/2001 | Kim | ....................... | H10B 12/09 |
| | | | | 438/266 |
| 2001/0054725 A1* | 12/2001 | Nagai | .............. | H10D 64/01312 |
| | | | | 257/E21.654 |
| 2002/0125536 A1* | 9/2002 | Iwasa | ..................... | H10D 30/62 |
| | | | | 257/E21.651 |
| 2005/0263825 A1* | 12/2005 | Frohberg | .......... | H01L 21/76829 |
| | | | | 257/369 |
| 2014/0004690 A1* | 1/2014 | Isogai | .................... | H10B 12/09 |
| | | | | 438/586 |
| 2024/0090206 A1* | 3/2024 | Moriwaki | .............. | H10B 12/50 |

* cited by examiner

*Primary Examiner* — Shaun M Campbell
(74) *Attorney, Agent, or Firm* — JCIPRNET

(57)　　　　ABSTRACT

A semiconductor device, including a first MOS device, a second MOS device, a first dielectric layer, a stop layer, and a second dielectric layer, is provided. The first MOS device and the second MOS device are located on a substrate. The first dielectric layer is beside the first MOS device and the second MOS device. The stop layer is disposed on the first dielectric layer. The second dielectric layer covers the stop layer. The thickness of the second dielectric layer above the first MOS device is greater than the thickness of the second dielectric layer above the second MOS device.

6 Claims, 16 Drawing Sheets

SEMICONDUCTOR DEVICE AND METHOD OF MANUFACTURING THE SAME

BACKGROUND

Technical Field

The disclosure relates to a semiconductor device and a method of manufacturing the same, and particularly to a dynamic random access memory (DRAM) and a method for manufacturing the same.

Description of Related Art

Nowadays, stacked DRAM with capacitors stacked on top of transistors achieves the goal of high memory density. However, the material layers of the stacked dynamic random access memory may form dangling bonds during the manufacturing process, which may cause reliability problems of the NMOS elements.

SUMMARY

The disclosure provides a semiconductor device and a method of manufacturing the same, which improves the reliability of the first element (e.g., NMOS) and avoids the deterioration of the components of the memory cell region and the second element (e.g., PMOS) of the peripheral circuit region.

The disclosure provides a semiconductor device according to an embodiment of the disclosure, including: a first MOS device located on a substrate, a second MOS device located on the substrate, a first dielectric layer beside the first MOS device and the second MOS device, a stop layer located above the first dielectric layer, and a second dielectric layer covering the stop layer. The thickness of the second dielectric layer above the first MOS device is greater than the thickness of the second dielectric layer above the second MOS device.

A semiconductor device according to an embodiment of the disclosure includes: a first MOS device located on a substrate, a second MOS device located on the substrate, a first dielectric layer beside the first MOS device and the second MOS device, a first stop layer located above the first dielectric layer, and a second stop layer disposed on the first stop layer. The thickness of the second stop layer above the first MOS device is greater than the thickness of the second stop layer above the second MOS device.

A method of manufacturing a semiconductor device according to an embodiment of the disclosure includes: forming a first MOS device and a second MOS device on a substrate, forming a first dielectric layer beside the first MOS device and the second MOS device, forming a first stop layer above the first dielectric layer, removing at least part of the first stop layer to form an opening corresponding to the first MOS device in the first stop layer, performing a treatment process, and forming a second dielectric layer covering the stop layer.

BRIEF DESCRIPTION OF THE DRAWINGS

FIG. 4A to FIG. 4D are cross-sectional schematic views of a manufacturing process of the dynamic random access memory according to another embodiment of the disclosure taken along a line I-I' of FIG. 1.

FIG. 5A to FIG. 5D are cross-sectional schematic views of a manufacturing process of the dynamic random access memory according to another embodiment of the disclosure taken along a line II-II' of FIG. 1.

DESCRIPTION OF THE EMBODIMENTS

Figure 1:
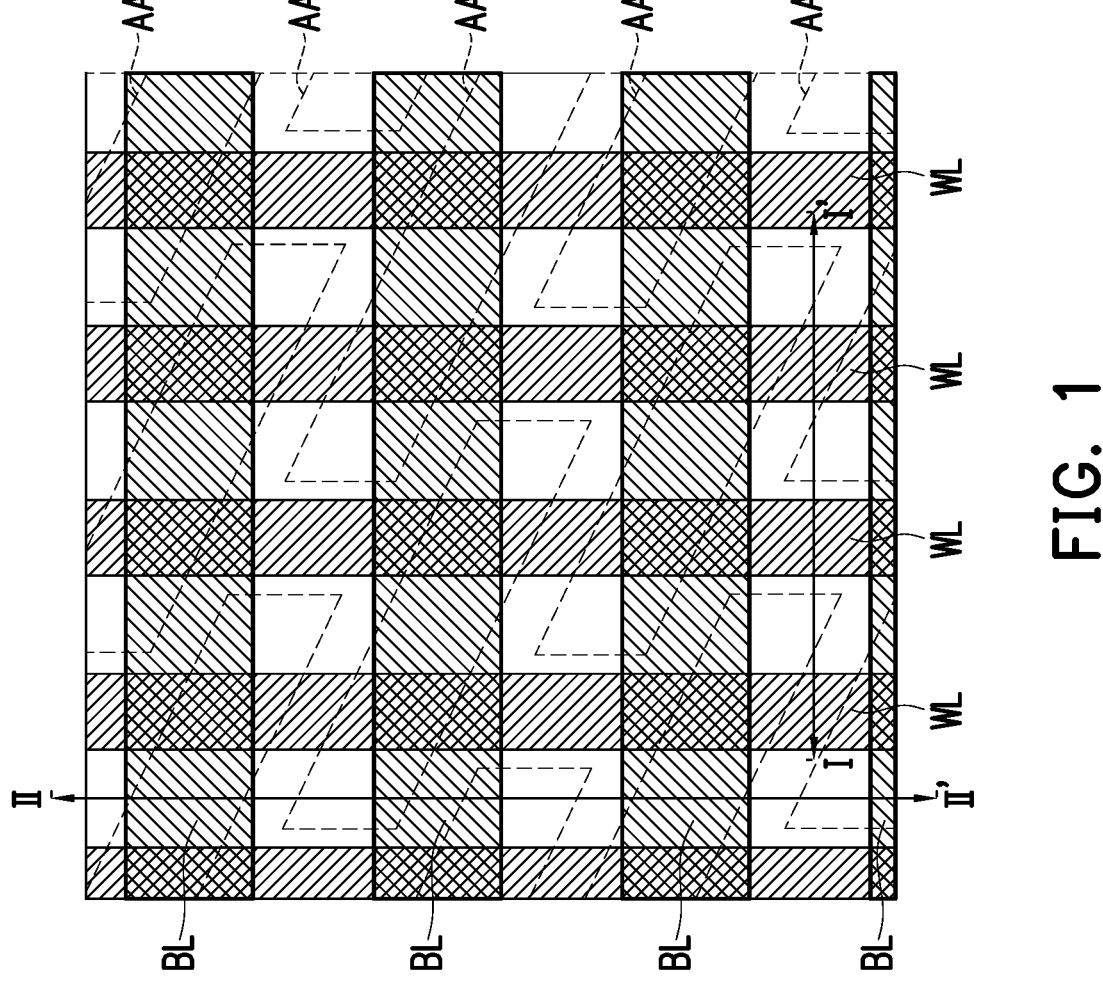
FIG. 1 is a schematic top view of a dynamic random access memory (DRAM) according to an embodiment of the disclosure.
Figures 2A, 3A:
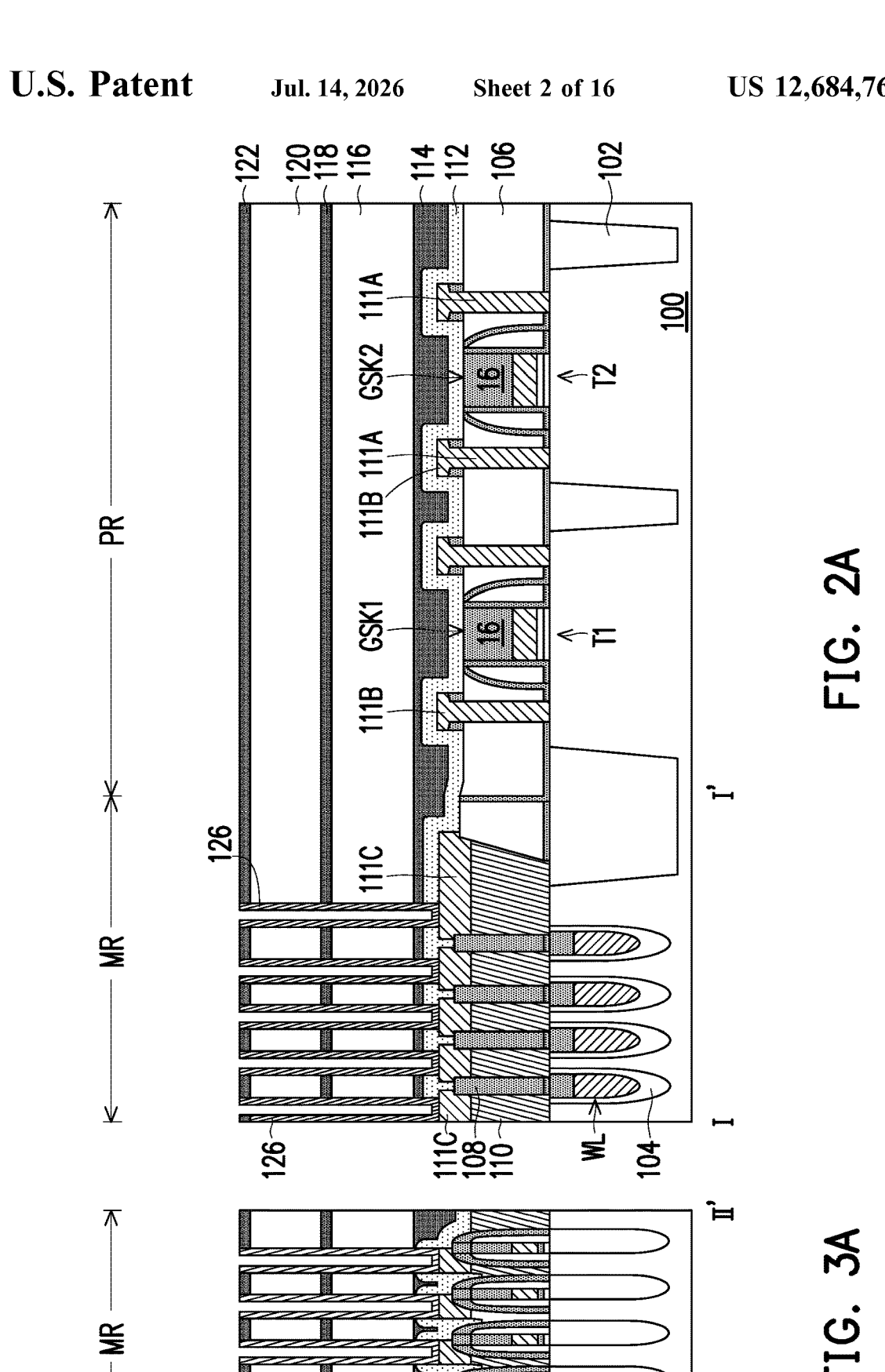
FIG. 2A to FIG. 2G are cross-sectional schematic views of a manufacturing process of the dynamic random access memory according to an embodiment of the disclosure taken along a line I-I' of FIG. 1.
FIG. 3A to FIG. 3G are cross-sectional schematic views of a manufacturing process of the dynamic random access memory according to an embodiment of the disclosure taken along a line II-II' of FIG. 1.

Referring to FIG. 1, FIG. 2A, and FIG. 3A, a substrate 100 is provided. The substrate 100 is, for example, a semiconductor substrate such as a silicon substrate. The substrate 100 includes a memory cell region MR and a peripheral circuit region PR. An isolation structure 102 is formed in the substrate 100 and multiple active regions AA are defined. Then, a buried word line WL is formed in the substrate 100. An insulating layer 104 is also formed between the buried word line WL and the substrate 100 and the buried word line WL is electrically isolated from the substrate 100. Next, a first element T1 and a second element T2 are formed on the substrate 100 of the peripheral circuit region PR. The first element T1 and the second element T2 may be MOS devices. The first element T1 is, for example, an N-channel metal oxide semiconductor field effect transistor. The second element T2 is, for example, a P-channel metal oxide semiconductor field effect transistor. A bit line structure BL is also formed on the substrate 100. The buried word line WL and the bit line structure BL include conductor materials such as tungsten.

After that, a dielectric layer 106 is formed on the substrate 100 of the peripheral circuit region PR. The dielectric layer 106 is, for example, silicon oxide. The dielectric layer 106 may be planarized through a chemical mechanical planarization process.

Thereafter, the dielectric layer 106 is patterned to form openings (not shown) in the dielectric layer 106 of the memory cell region MR. After that, a dielectric layer 108 is formed in the opening and above the dielectric layer 106, and the dielectric layer 108 is planarized to expose the dielectric layer 108 of the memory cell region MR.

Then, the dielectric layer 106 exposed by the memory cell region MR is removed to form an opening, and a contact 110 is formed in the opening, and the material of the contact 110 is, for example, polysilicon.

Next, the dielectric layer 106 and the dielectric layer 108 are patterned to form a contact opening (not shown) in the dielectric layer 106 and the dielectric layer 108 of the peripheral circuit region PR.

Then, a conductor layer, such as tungsten, is formed on the substrate 100. Furthermore, the conductor layer fills the contact opening. Next, the conductor layer is patterned to form multiple contacts 111A and multiple leads 111B in the peripheral circuit region PR, and multiple conductor pads 111C in the memory cell region MR. The leads 111B are electrically connected to the first element T1 or the second element T2 via the contacts 111A. The conductor pads 111C are electrically connected to the contact 110.

Then, a stop layer 112 and a stop layer 114 are formed on the substrate 100. The stop layer 112 and the stop layer 114 are, for example, silicon nitride. The stop layer 112 is a conformal layer formed by, for example, atomic layer deposition. The stop layer 114 is, for example, a planarization layer deposited by chemical vapor deposition and planarized by etch-back process or chemical mechanical planarization process. The stop layer 112 has good step coverage and a quality that is better than that of the stop layer 114. The stop layer 114 has a better etching selectivity than the stop layer 112.

Thereafter, a dielectric layer 116, a stop layer 118, a dielectric layer 120, and a stop layer 122 are formed above the stop layer 114. The material of the stop layer 118 and the stop layer 122 are different from the material of the dielectric layer 116 and the dielectric layer 120. The stop layer 118 and the stop layer 122 are, for example, silicon nitride. The dielectric layer 116 and the dielectric layer 122 are, for example, silicon oxide.

Figures 2B, 3B:
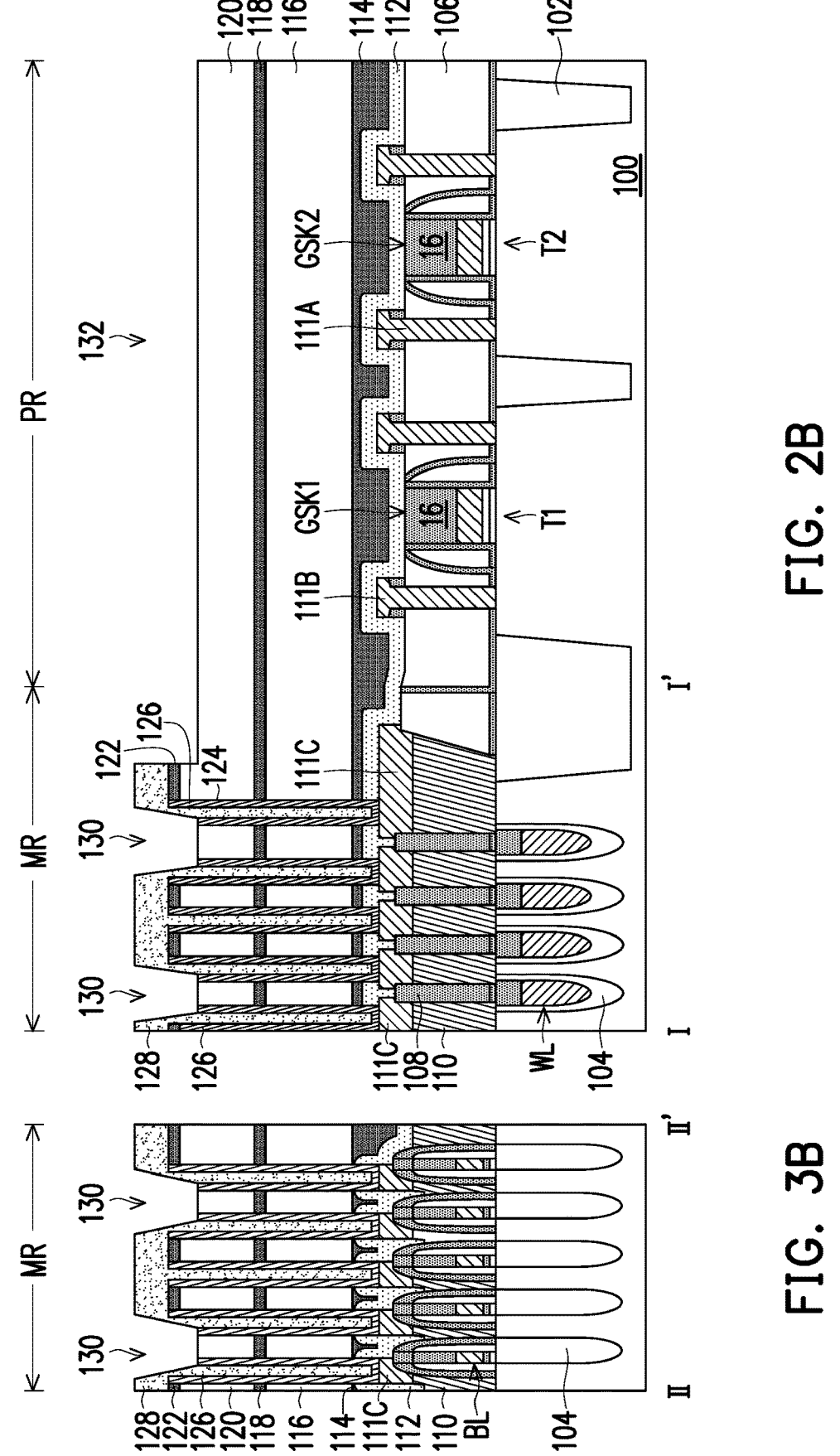

Next, referring to FIG. 2B and FIG. 3B, a patterning process is performed to form multiple capacitor openings 124 in the stop layer 114, the dielectric layer 116, the stop layer 118, the dielectric layer 120, and the stop layer 122 of the memory cell region MR. Thereafter, multiple lower electrodes 126 are formed in the capacitor openings 124. The material of the lower electrode 126 is, for example, titanium nitride or ruthenium. The lower electrodes 126 are electrically connected to the conductor pads 111C below. The method for forming the lower electrodes 126 includes, for example, the steps below. First, a conductor layer is formed above the stop layer 122 and in the capacitor openings 124. Then, the stop layer 122 is used as a polishing stop layer and the excess conductor layer covering the stop layer 122 is removed through a chemical mechanical polishing process.

Referring to FIG. 2B and FIG. 3B, a mask layer 128 is formed on the substrate 100 and the mask layer 128 is patterned to form multiple holes 130 and openings 132. The holes 130 are exposed at the stop layer 122 of the memory cell region MR, and the openings 132 are exposed at the stop layer 122 of the peripheral circuit region PR. Thereafter, using the mask layer 128 as a mask, an etching process is performed to remove the stop layer 122 exposed by the holes 130 and the dielectric layer 120 below the stop layer 122.

Figures 2C, 3C:
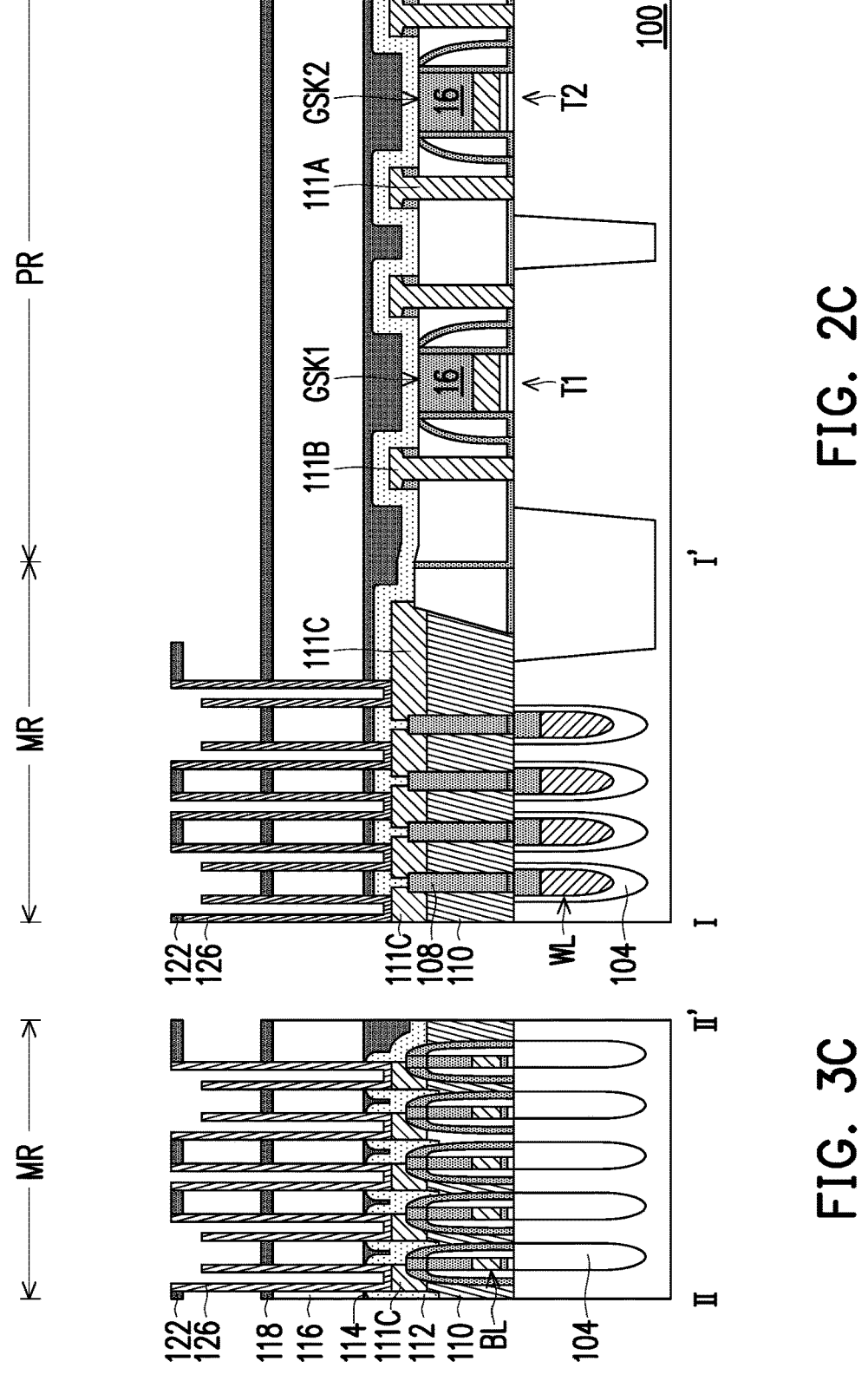

Referring to FIG. 2C and FIG. 3C, using the mask layer 128 as a mask and the stop layer 118 as an etch stop layer, the stop layer 122 and the dielectric layer 120 that are not covered by the mask layer 128 are removed.

Figures 2D, 3D:
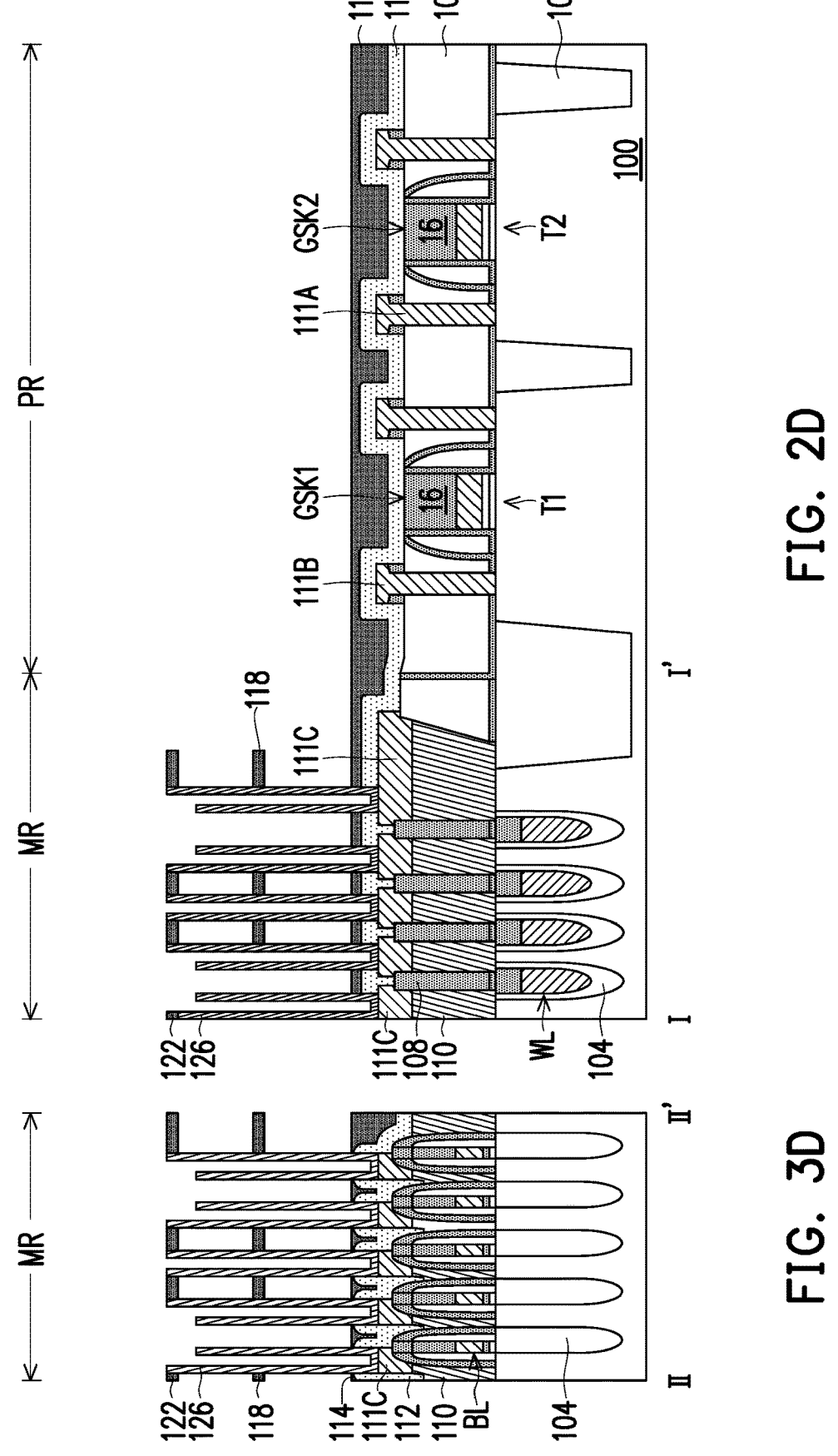

Referring to FIG. 2D and FIG. 3D, a part of the stop layer 118 is removed. Thereafter, using the stop layer 114 as the etch stop layer, an etching process is performed to remove the dielectric layer 116. So far, the surface of the lower electrode 126 is exposed. In some embodiment, the lower electrode 126 has a cylindrical profile.

Figures 2E, 3E:
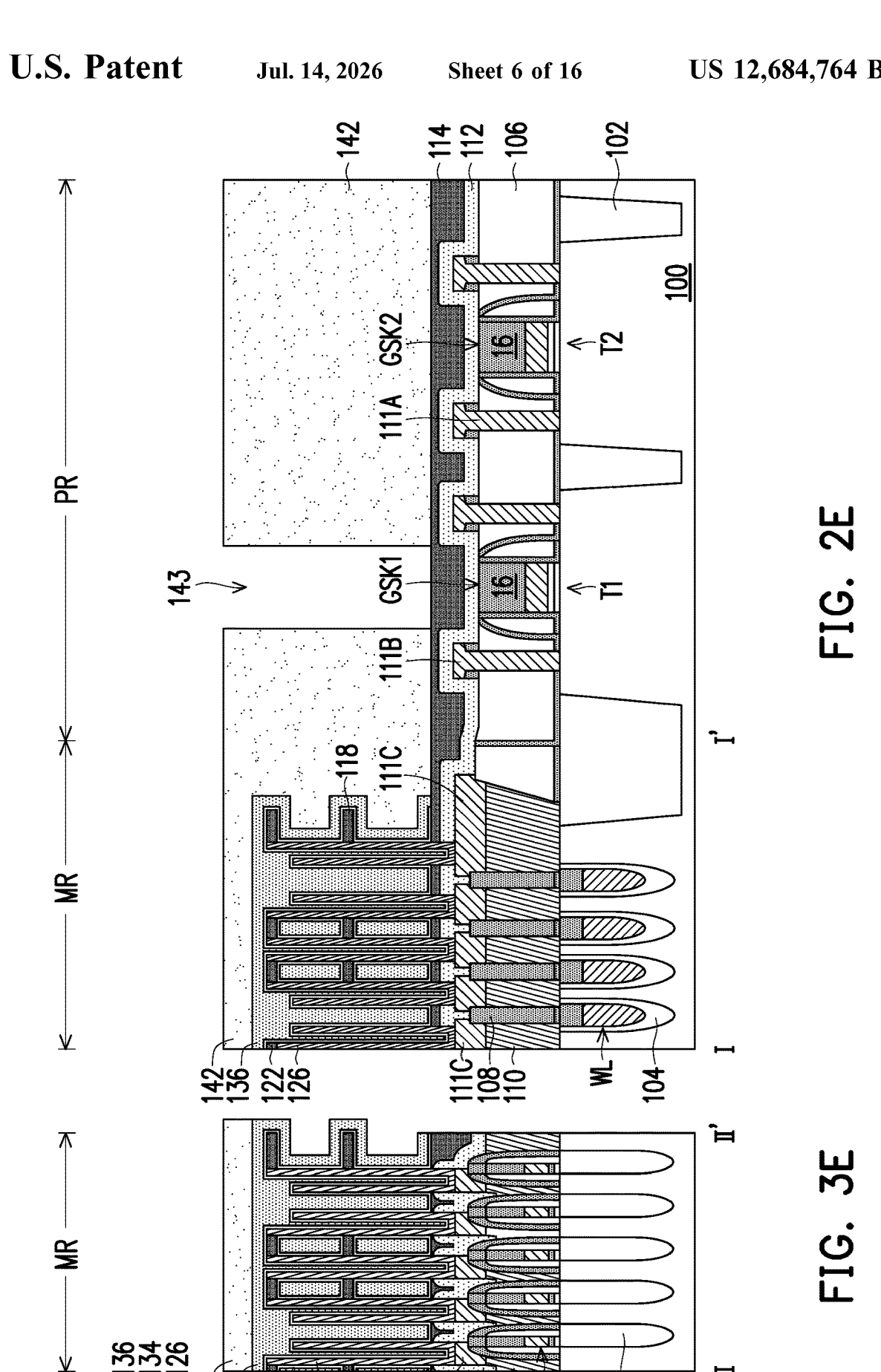

Referring to FIG. 2E and FIG. 3E, a dielectric 134 is formed above the surfaces of the lower electrode 126 and the stop layer 114. The dielectric 134 is, for example, a high dielectric constant dielectric material. Next, an upper electrode 136 is formed above the dielectric layer 134. The material of the upper electrode 136 is, for example, titanium nitride, tungsten, or silicon-germanium. The method of forming the dielectric 134 and the upper electrode 136 is, for example, forming a dielectric material and a conductor material on the substrate 100, and then performing a photolithography and etching process to remove the conductor material and the dielectric material of the peripheral circuit region PR. The lower electrode 126, the dielectric 134, and the upper electrode 136 form the capacitor 140.

Referring to FIG. 2E and FIG. 3E, a mask layer 142 is formed on the substrate 100. The mask layer 142 is, for example, a photo resist layer. Thereafter, the mask layer 142 is patterned to form the opening 143. The opening 143 exposes the stop layer 114 above a gate structure GSK1 of the first element T1 of the peripheral circuit region PR. The mask layer 142 covers a gate structure GSK2 of the second element T2 of the peripheral circuit region PR and the capacitor 140 of the memory cell region MR.

Figures 2F, 3F:
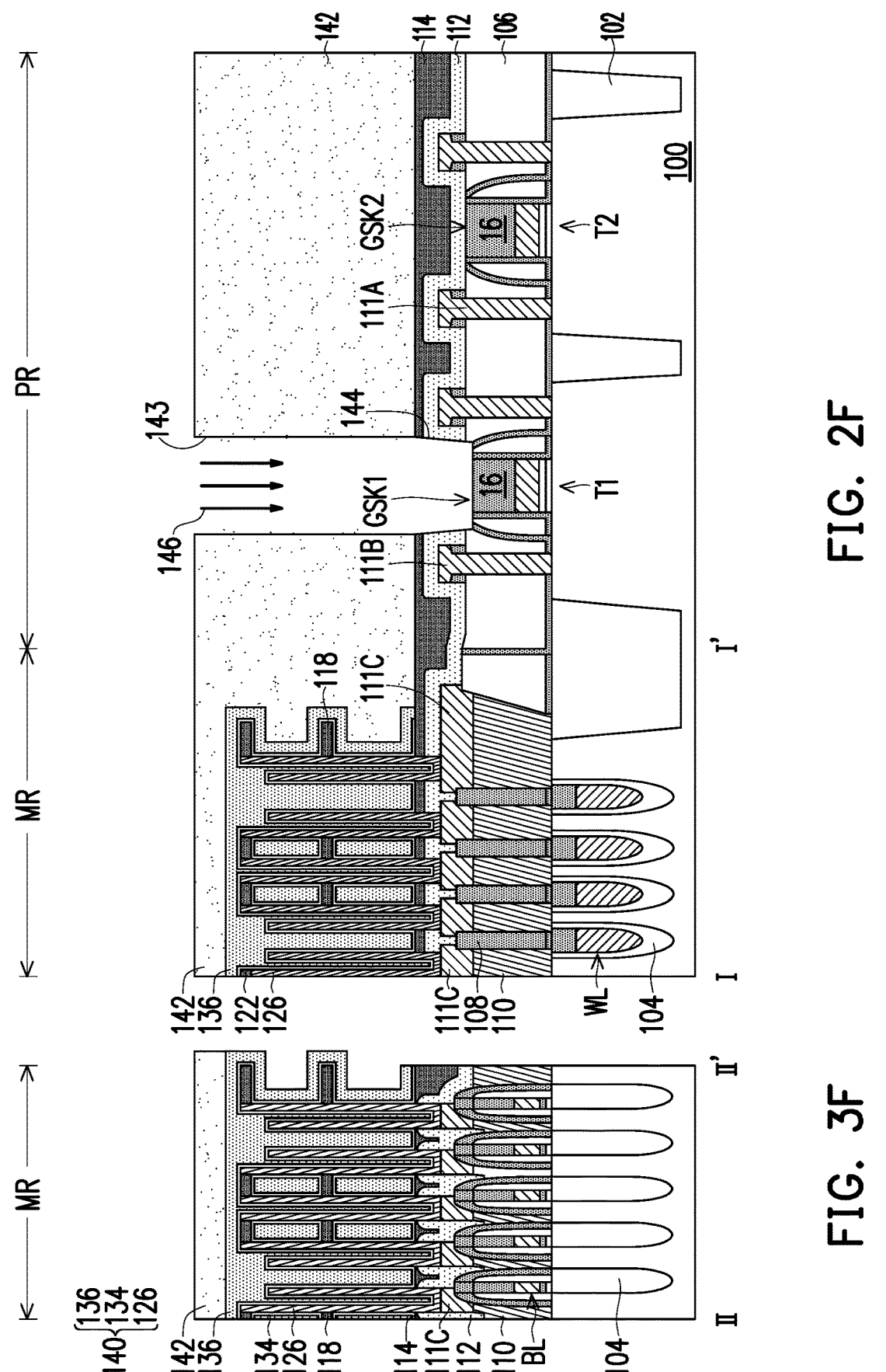

Referring to FIG. 2F and FIG. 3F, using the mask layer 142 as an etching mask, an etching process is performed to remove the stop layer 112 and the stop layer 114 above the gate structure GSK1 to form an opening 144. The opening 144 exposes a cap layer 16 on the top of the gate structure the gate1. Next, treatment process 146 is performed. The treatment process 146 is, for example, a H2 sintering process for removing the floating bond in the cap layer 16 of the gate structure GSK1, thereby improving the reliability of the first element T1. Since the capacitor 140 of the memory cell region MR and the second element T2 of the peripheral circuit region PR are covered by the mask layer 142, the diffusion of the gas used in the treatment process 146 may be prevented or reduced, so that the deterioration of the capacitor 140 of the memory cell region MR and the second element T2 of the peripheral circuit region PR may be avoided.

Figures 2G, 3G:
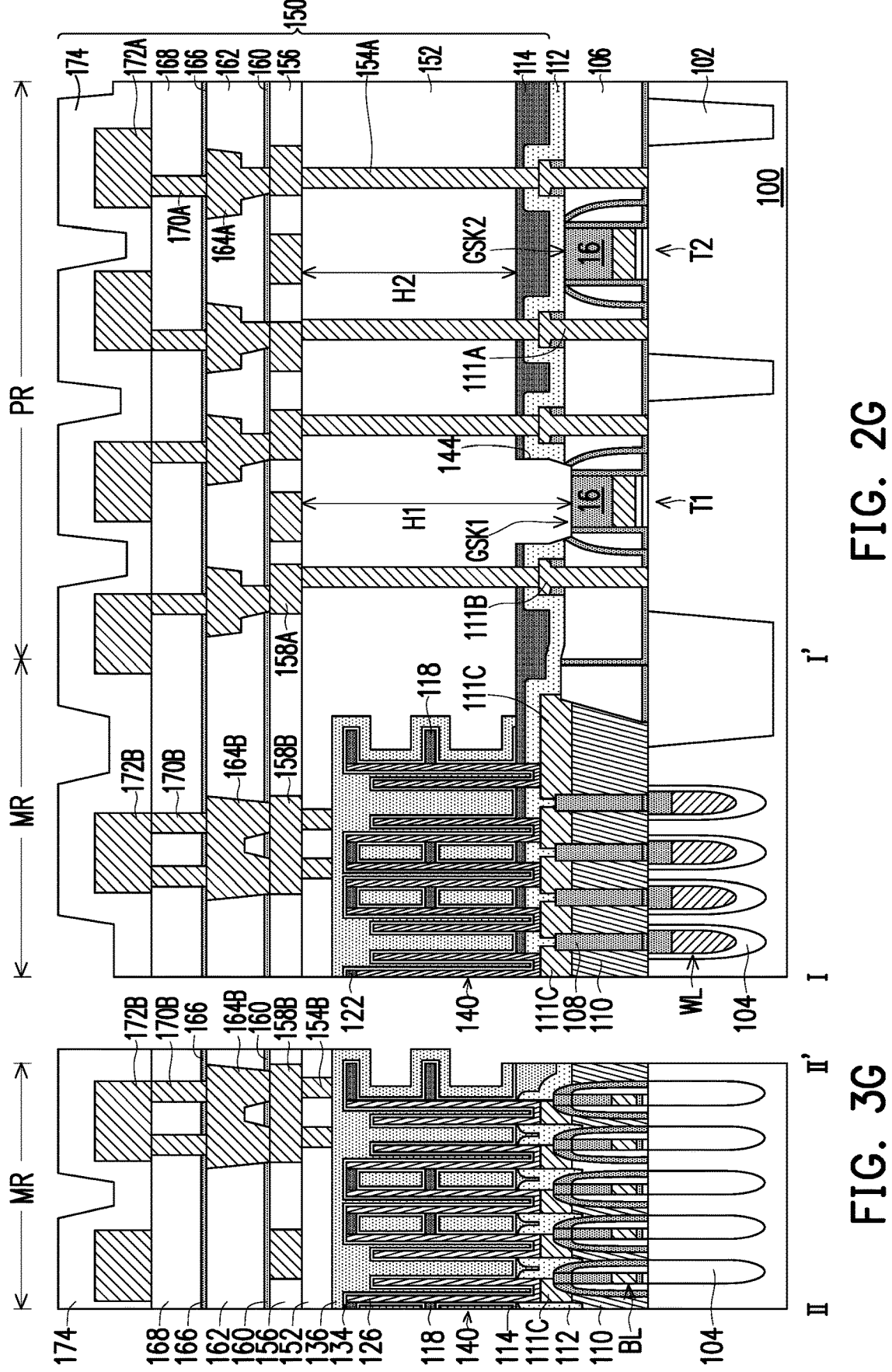

Referring to FIG. 2G and FIG. 3G, the mask layer 142 is removed. Next, an interconnect structure 150 is formed on the substrate 100. The interconnect structure 150 includes a dielectric layer 152, a contact 154A, a contact 154B, a dielectric layer 156, a lead 158A, a lead 158B, a stop layer 160, a dielectric layer 162, conductive features 164A and 164B (including leads and vias), a stop layer 166, a dielectric layer 168, a via 170A, a via 170B, a lead 172A, a lead 172B, and a protective layer 174. The dielectric layer 152 is for example, silicon oxide formed by plasma-enhanced chemical vapor deposition.

The contact 154A extends through the dielectric layer 152 and is electrically connected to the first element T1 or the second element T2 through the lead 111B and the contact 111A, respectively. The contact 154A is also electrically connected to the lead 158A, the conductive feature 164A, the via 170A, and the lead 172A formed subsequently. The contact 154B extends through the dielectric layer 152 and is electrically connected to the upper electrode 136 of the capacitor 140. The contact 154B is also electrically connected to the lead 158B, the conductive feature 164B, the via 170B, and the lead 172B formed subsequently. The interconnect structure 150 may be formed by any known method, and details are not described herein again.

In this embodiment, the dielectric layer 152 is filled in the opening 144 and is in contact with the cap layer 16 of the gate structure GSK1 of the first element T1 of the peripheral circuit region PR. The dielectric layer 152 and the cap layer 16 of the gate structure GSK2 of the second element T2 of the peripheral circuit region PR are separated by the stop layer 112 and the stop layer 114. Therefore, the thickness H1 of the dielectric layer 152 above the first element T1 of the peripheral circuit region PR is greater than the thickness H2 of the dielectric layer 152 above the second element T2 of the peripheral circuit region PR. This embodiment is a pre-capacitor process and the treatment process is performed after the capacitor is formed. Nevertheless, the disclosure is not limited thereto. This embodiment of the disclosure may also include post-capacitor process where and the treatment process is performed after the capacitor is formed.

Figures 4A, 5A:
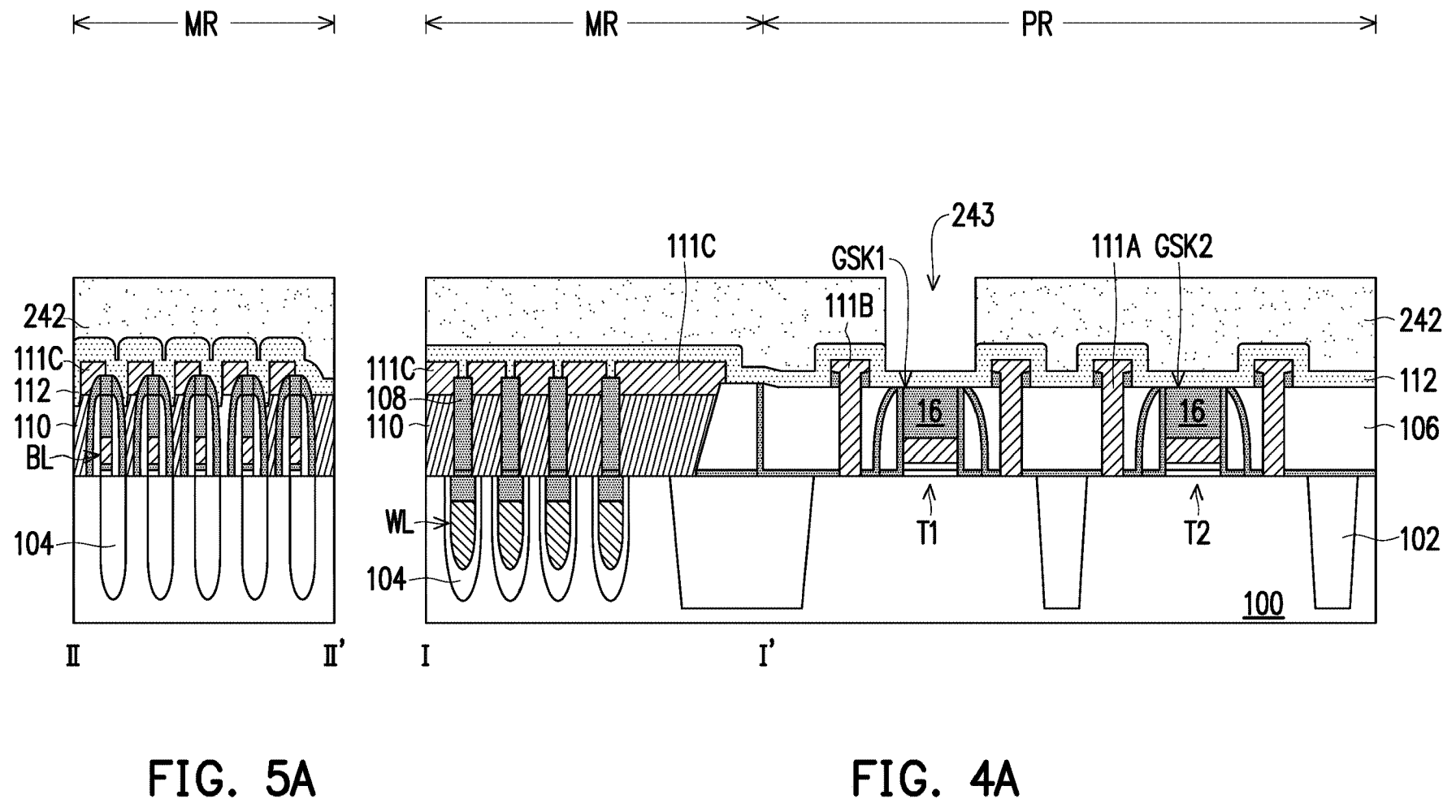

Referring to FIG. 4A and FIG. 5A, after the contact 111A, the lead 111B, and the conductor pad 111C are formed according to the above method, a stop layer 112 is formed above the substrate 100. Before forming the stop layer 114, a mask layer 242 is first formed on the substrate 100. The mask layer 242 may be a photo resist layer, for example. Thereafter, the mask layer 242 is patterned to form the opening 243. The opening 243 exposes the stop layer 112 above a gate structure GSK1 of the first element T1 of the peripheral circuit region PR. The mask layer 242 covers the gate structure GSK2 of the second element T2 of the peripheral circuit region PR and the stop layer 112 of the memory cell region MR.

Figures 4B, 5B:
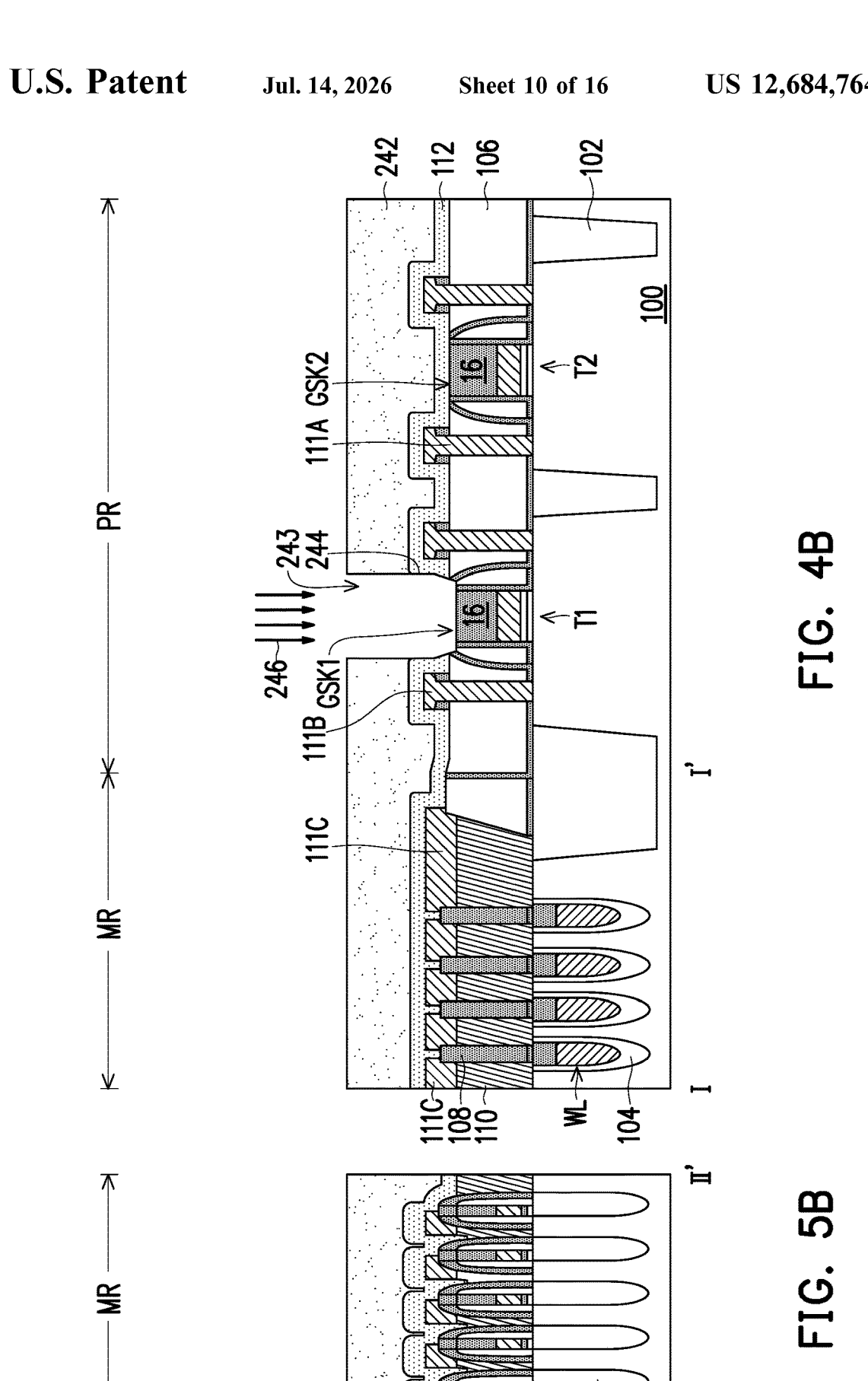

Referring to FIG. 4B and FIG. 5B, using the mask layer 242 as an etching mask, an etching process is performed to remove the stop layer 112 above the gate structure GSK1 to form an opening 244. The opening 244 exposes the cap layer 16 of the gate structure GSK1. Next, treatment process 246 is performed. The treatment process 246 is, for example, a H2 sintering process for removing the floating bond in the cap layer 16 of the gate structure GSK1, thereby improving the reliability of the first element T1. Since the capacitor 140 of the memory cell region MR and the second element T2 of the peripheral circuit region PR are covered by the mask layer 242 and the stop layer 112, the diffusion of the gas used in the treatment process 246 may be prevented or reduced, so that the deterioration of the capacitor 140 of the memory cell region MR and the second element T2 of the peripheral circuit region PR may be avoided.

Figures 4C, 5C:
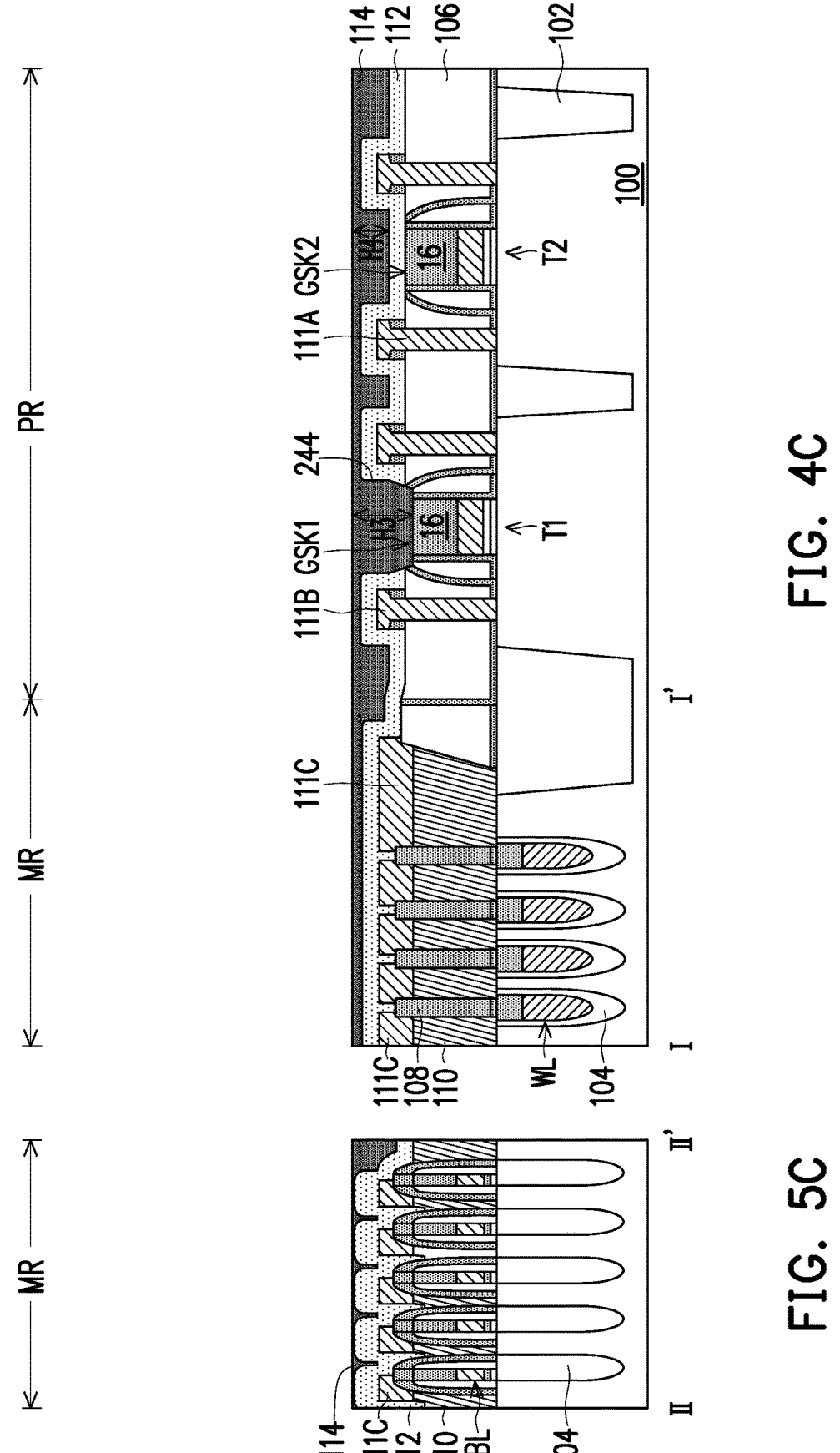

Referring to FIG. 4C and FIG. 5C, the mask layer 242 is removed. Then, the stop layer 114 is formed on the substrate 100. The stop layer 114 is filled in the opening 244 and is in contact with the cap layer 16 of the gate structure GSK1 of the first element T1 of the peripheral circuit region PR. The stop layer 114 and the cap layer 16 of the gate structure GSK2 of the second element T2 of the peripheral circuit region PR are separated by the stop layer 112. Therefore, the thickness H3 of the stop layer 114 above the first element T1 of the peripheral circuit region PR is greater than the thickness H4 of the stop layer 114 above the second element T2 of the peripheral circuit region PR.

Figures 4D, 5D:
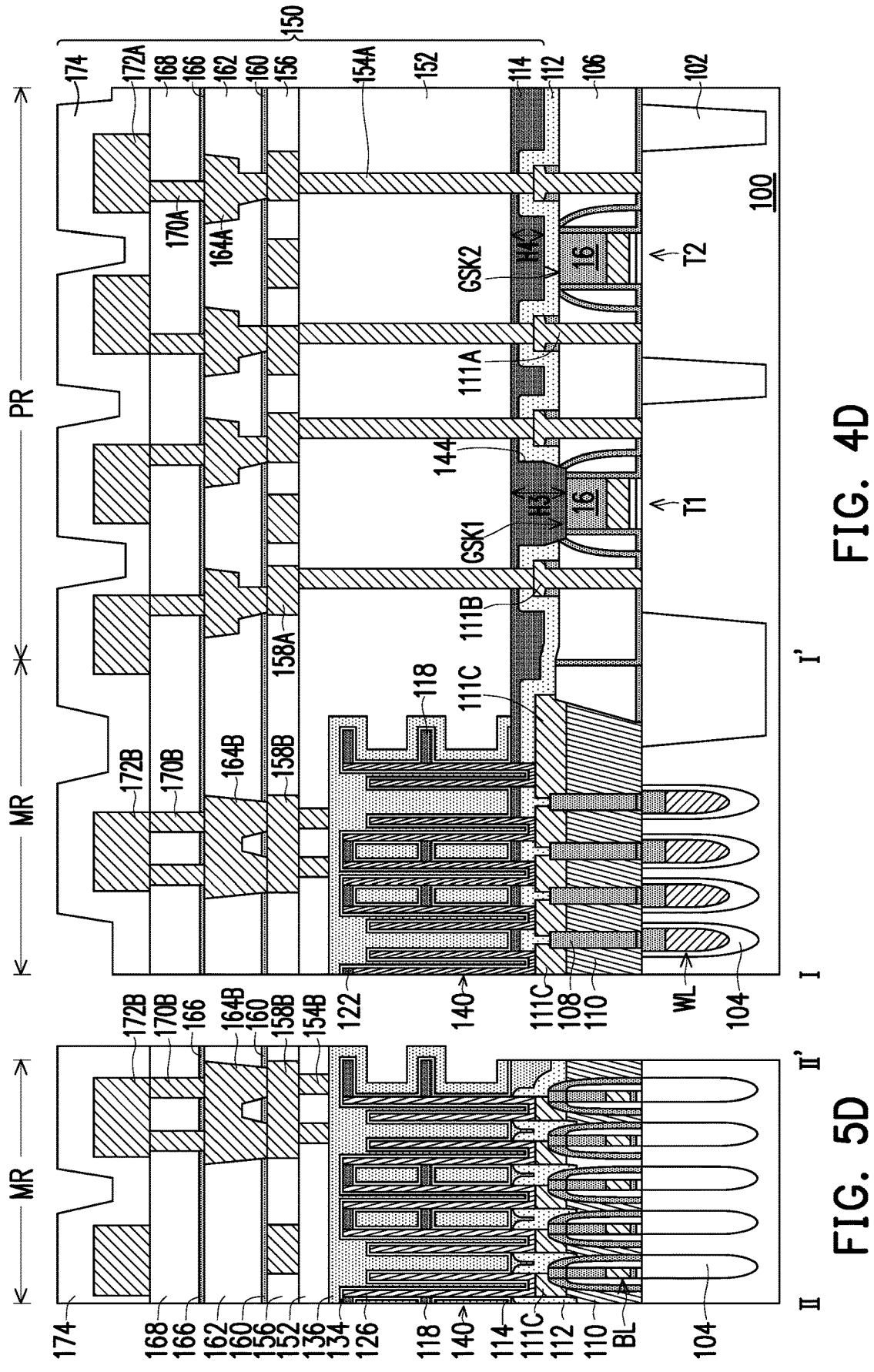

Referring to FIG. 4D and FIG. 5D, the capacitor 140 and the interconnect structure 150 are formed according to the above method.

In this embodiment, the stop layer 112 above the gate structure GSK1 of the first element T1 is completely removed. Nevertheless, the disclosure is not limited thereto. The stop layer 112 above the gate structure GSK1 of the first element T1 may be partially removed as shown in FIG. 6A to FIG. 6D.

Figures 6A, 7A:
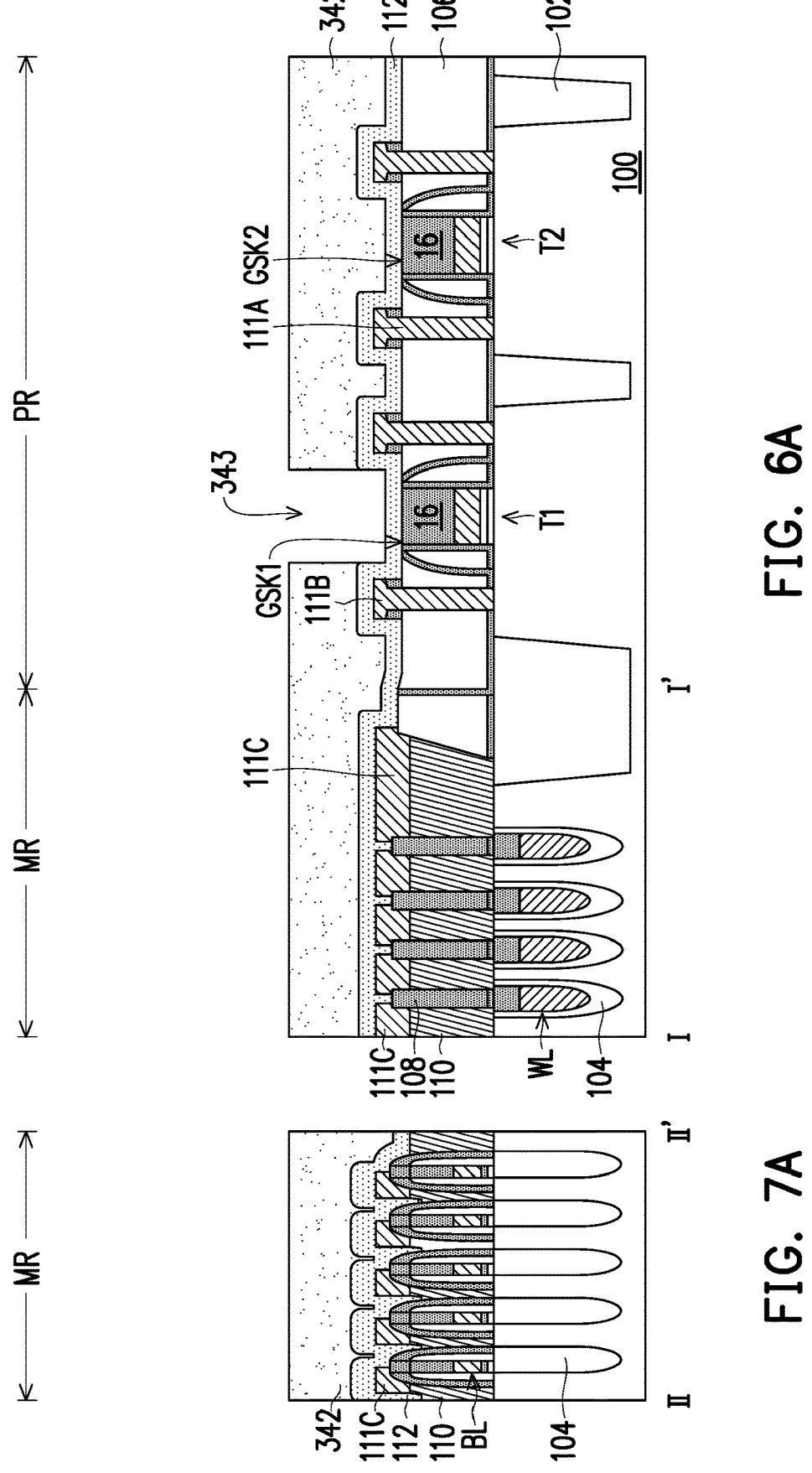
FIG. 6A to FIG. 6D are cross-sectional schematic views of a manufacturing process of the dynamic random access memory according to another embodiment of the disclosure taken along a line I-I' of FIG. 1.
FIG. 7A to FIG. 7D are cross-sectional schematic views of a manufacturing process of the dynamic random access memory according to another embodiment of the disclosure taken along a line II-II' of FIG. 1.

Referring to FIG. 6A and FIG. 7A, a mask layer 342 is formed according to the method of forming the mask layer 242. The mask layer 342 has an opening 343 that exposes the stop layer 112 above the gate structure GSK1 of the first element T1 of the peripheral circuit region PR. The mask layer 342 covers the gate structure GSK2 of the second element T2 of the peripheral circuit region PR and the stop layer 112 of the memory cell region MR.

Figures 6B, 7B:
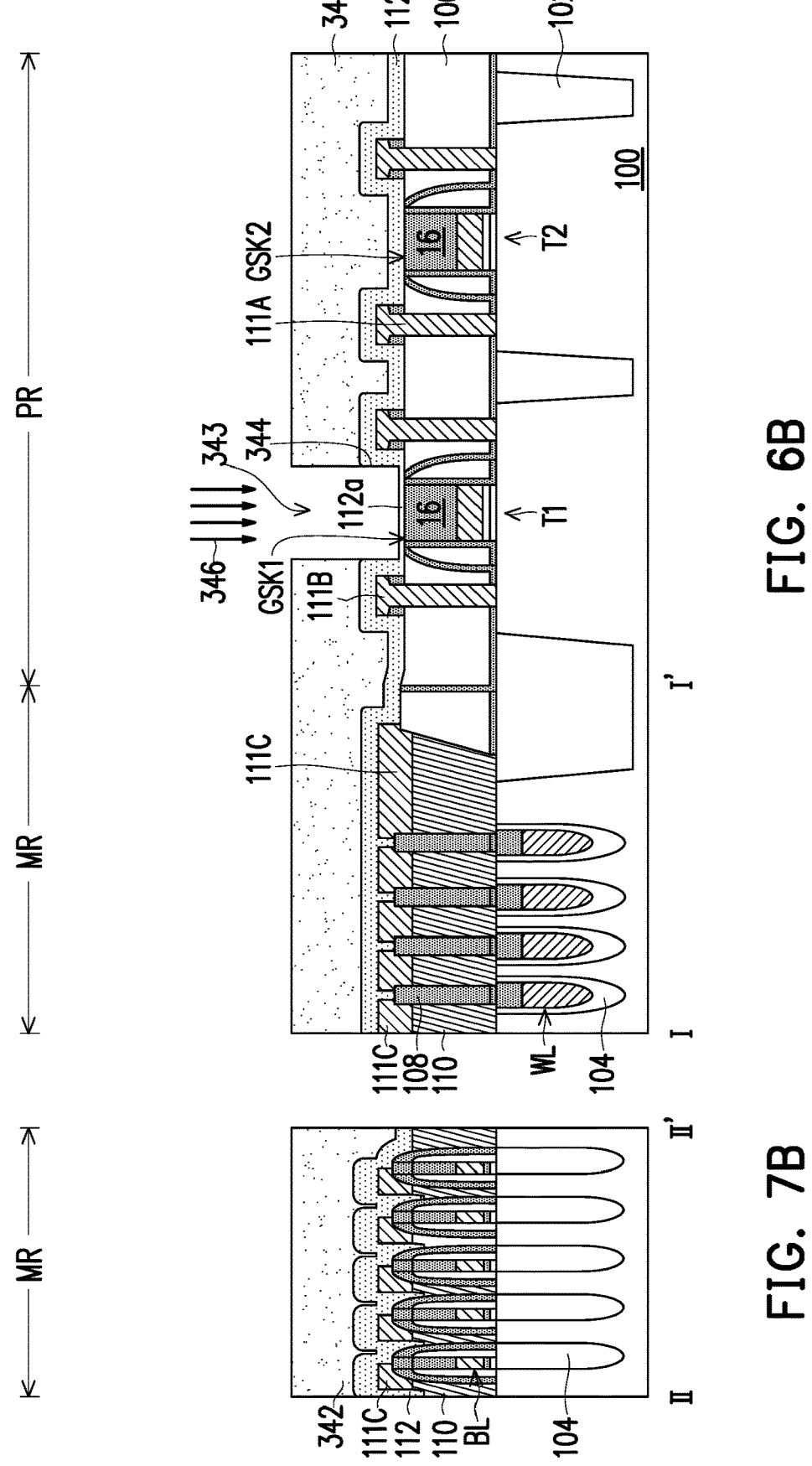

Referring to FIG. 6B and FIG. 7B, using the mask layer 342 as an etching mask, an etching process is performed to remove part of the stop layer 112 above the gate structure GSK1 to form an opening 344. The opening 344 exposes a stop layer 112a remaining above the cap layer 16 of the gate structure GSK1. Next, treatment process 346 is performed. The treatment process 346 is, for example, the H2 sintering process. Since the stop layer 112a of the cap layer 16 of the gate structure GSK1 is thin, the gas may still pass through the stop layer 112a to remove the floating bond in the cap layer 16 of the gate structure GSK1, thereby improving the reliability of the first element T1. Since the capacitor 140 of the memory cell region MR and the second element T2 of the peripheral circuit region PR are covered by the mask layer 342 and the stop layer 112 that is thicker, the diffusion of the gas used in the treatment process 346 may be prevented or reduced, so that the deterioration of the capacitor 140 of the memory cell region MR and the second element T2 of the peripheral circuit region PR may be avoided.

Figures 6C, 7C:
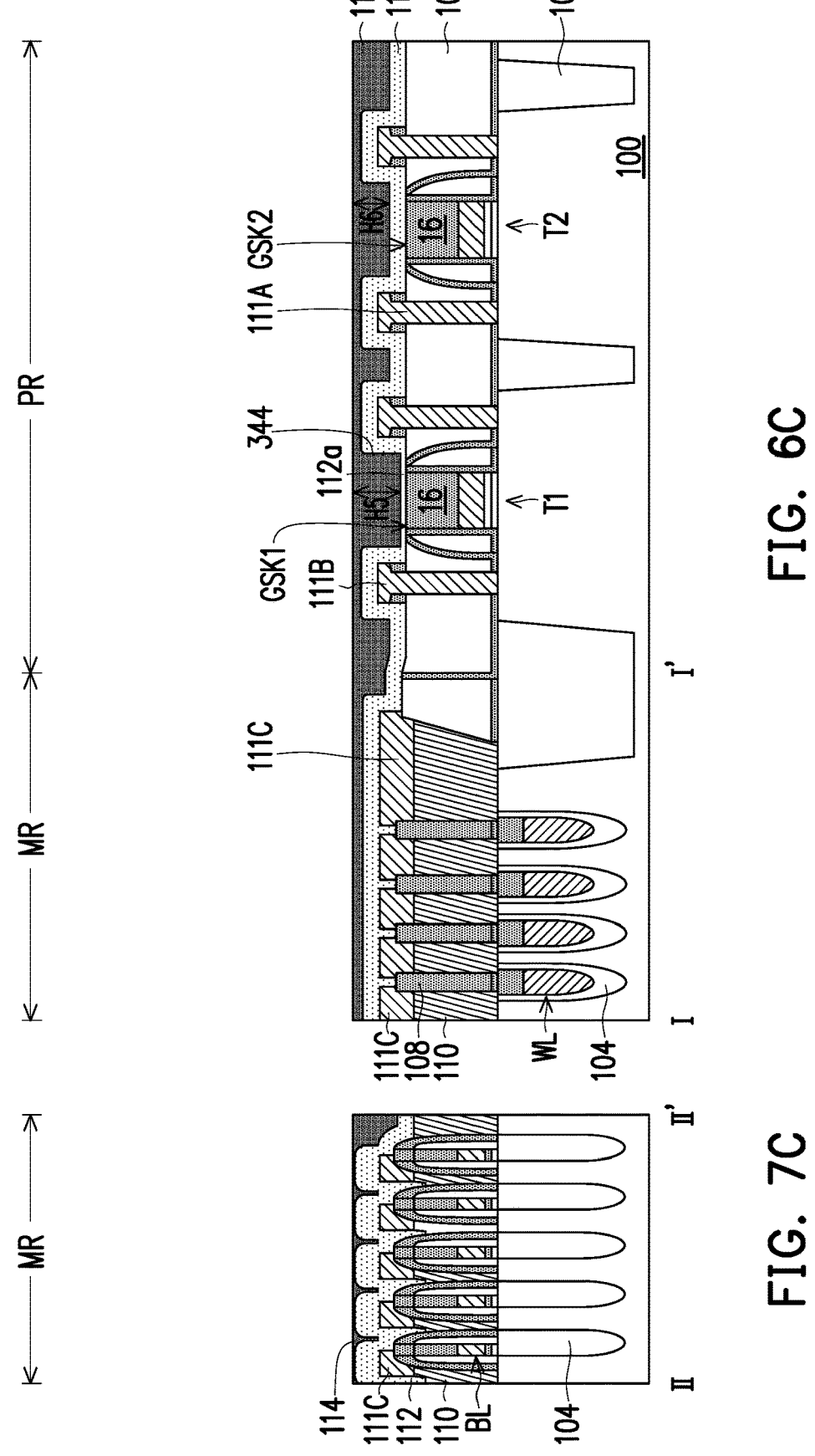

Referring to FIG. 6C and FIG. 7C, the mask layer 342 is removed. Then, the stop layer 114 is formed on the substrate 100. The stop layer 114 is filled in the opening 344 and is separated from the cap layer 16 of the gate structure GSK1 of the first element T1 of the peripheral circuit region PR by the stop layer 112a that is thinner. The stop layer 114 and the cap layer 16 of the gate structure GSK2 of the second element T2 of the peripheral circuit region PR are separated by the stop layer 112 that is thicker. Therefore, the thickness H5 of the stop layer 114 above the first element T1 of the peripheral circuit region PR is greater than the thickness H6 of the stop layer 114 above the second element T2 of the peripheral circuit region PR.

Figures 6D, 7D:
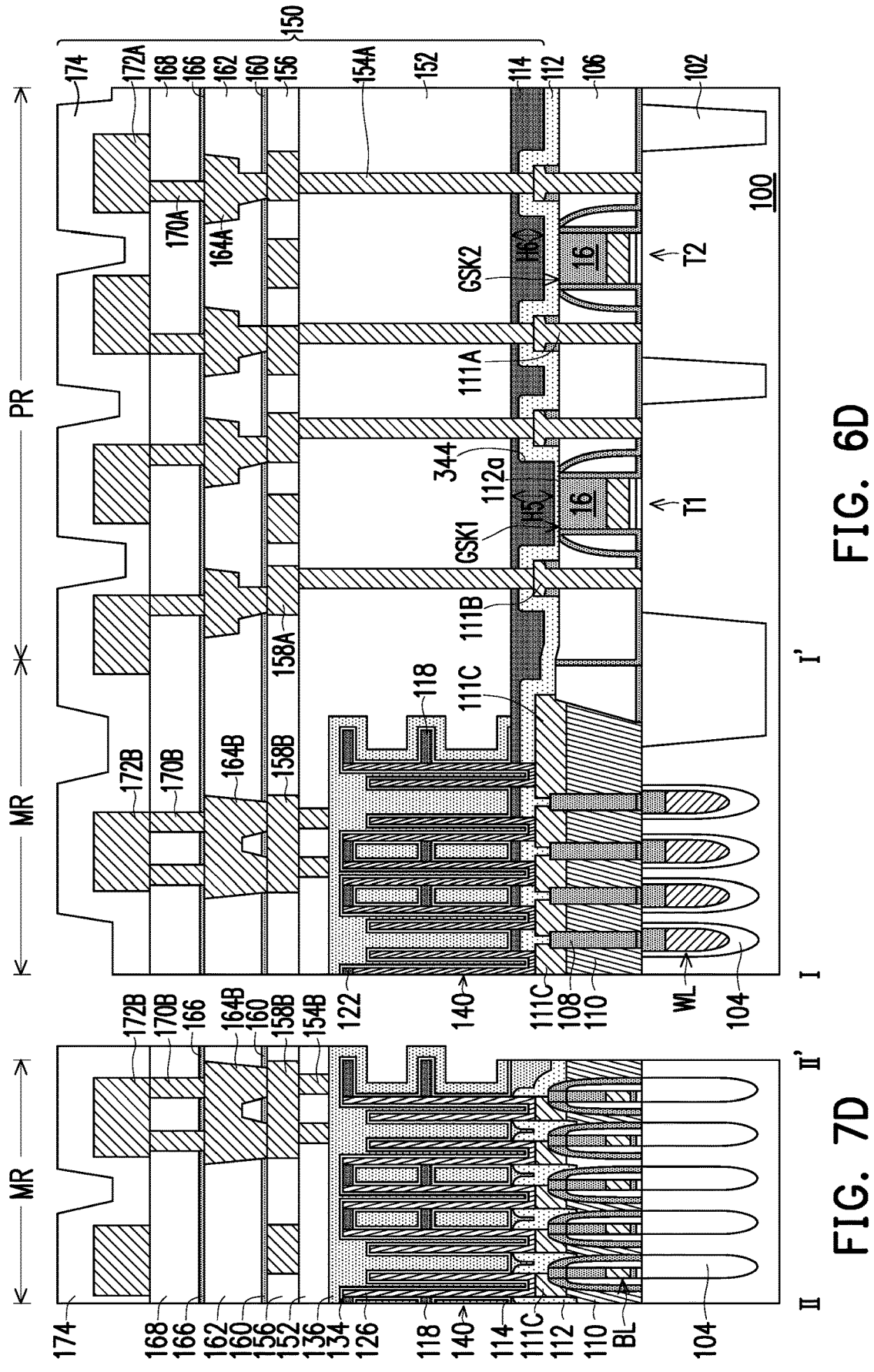

Referring to FIG. 6D and FIG. 7D, the capacitor 140 and the interconnect structure 150 are formed according to the above method.

The semiconductor device in the embodiment of the disclosure selectively removes or partially removes the stop layer above the first element (e.g., NMOS) of the peripheral circuit region through the formation of the mask layer, so that the treatment process (e.g., the sintering process) may be implemented for the first element (e.g., NMOS), and the reliability of the first element may be improved. Since the second element (e.g., PMOS) of the memory cell region and the peripheral circuit region is covered by the mask layer, the diffusion of the gas used in the treatment process may be prevented or reduced, so that the deterioration of the component of the memory cell region and the second element (e.g., PMOS) of the peripheral circuit region may be avoided.

What is claimed is:

1. A semiconductor device, comprising:
   a first MOS device located on a substrate;
   a second MOS device located on the substrate;
   a first dielectric layer completely filling a space between the first MOS device and the second MOS device;
   a stop layer disposed on a top surface of the first dielectric layer and the second MOS device; and
   a second dielectric layer covering the stop layer, wherein a thickness of the second dielectric layer above the first MOS device is greater than a thickness of the second dielectric layer above the second MOS device,
   wherein the second dielectric layer is not in contact with the second MOS device and is in direct contact with the first MOS device.

2. The semiconductor device according to claim 1, wherein the second dielectric layer extends through the stop layer to be in contact with the first MOS device.

3. The semiconductor device according to claim 2, wherein the first MOS device comprises an N-channel MOS device, and the second MOS device comprises a P-channel MOS device.

4. A semiconductor device, comprising:

a first MOS device located on a substrate;

a second MOS device located on the substrate;

a first dielectric layer completely filling a space between the first MOS device and the second MOS device;

a first stop layer disposed on a top surface of the first dielectric layer and the second MOS device; and a second stop layer disposed on the first stop layer, wherein a thickness of the second stop layer above the first MOS device is greater than a thickness of the second stop layer above the second MOS device, wherein the second stop layer is in direct contact with a top surface of the first stop layer.

5. The semiconductor device according to claim 4, wherein the second stop layer is in contact with the first MOS device.

6. The semiconductor device according to claim 4, wherein a thickness of the first stop layer between the second stop layer and the first MOS device is less than a thickness of the first stop layer between the second stop layer and the second MOS device.

* * * * *